United States Patent
Birdsley et al.

(10) Patent No.: US 6,210,981 B1
(45) Date of Patent: Apr. 3, 2001

(54) METHOD FOR ETCHING A FLIP CHIP USING SECONDARY PARTICLE EMISSIONS TO DETECT THE ETCH END-POINT

(75) Inventors: Jeffrey David Birdsley; Victoria Jean Bruce, both of Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/249,367

(22) Filed: Feb. 12, 1999

(51) Int. Cl.$^7$ .................................................... H01L 21/00
(52) U.S. Cl. ............................ 438/9; 438/14; 438/712; 216/60; 216/66
(58) Field of Search ............................ 438/8, 9, 14, 712; 216/59, 60, 66, 84, 85; 156/345 LC, 345 MT, 345 B (56) References Cited

U.S. PATENT DOCUMENTS

| 5,140,164 | * | 8/1992 | Talbot et al. | 216/66 |
| 5,629,244 | * | 5/1997 | Matsuzaki | 438/8 |
| 5,733,820 | * | 3/1998 | Adachi et al. | 216/60 X |
| 5,821,549 | | 10/1998 | Talbot et al. | |
| 5,844,416 | | 12/1998 | Campbell et al. | |

OTHER PUBLICATIONS

Brochure: 9800FC FIB System Operation, pp. 4–10, 4–11.

* cited by examiner

Primary Examiner—William Powell (57) ABSTRACT

A method for etching a flip chip using secondary particle emissions to detect the etch end-point. The method comprises supplying a voltage level to the device and directing an ion beam at a selected area of the back side of the device in the presence of a gas that is reactive with the substrate. While etching, the quantity of secondary particles emitted from the selected area of the device is monitored. When the quantity of emitted secondary particles reaches a predetermined level, the ion beam is stopped and the reactive gas is removed.

14 Claims, 6 Drawing Sheets

METHOD FOR ETCHING A FLIP CHIP USING SECONDARY PARTICLE EMISSIONS TO DETECT THE ETCH END-POINT

RELATED PATENT APPLICATIONS

This patent application is related to the co-pending patent application entitled, "SEMICONDUCTOR STRUCTURE HAVING BACKSIDE PROBE POINTS FOR DIRECT SIGNAL ACCESS FROM ACTIVE AND WELL REGIONS," by Birdsley et al., filed on Oct. 5, 1998, and having application Ser. No. 09/166,656, which is incorporated herein by reference.

FIELD OF THE INVENTION

The invention relates to semiconductor device assemblies, and more particularly to techniques for exposing for analysis selected circuitry of a flip chip bonded integrated circuit.

BACKGROUND

Advances in semiconductor technology have permitted dramatic increases in circuit density and complexity, and equally dramatic decreases in power consumption and package sizes. Present semiconductor technology now permits singlechip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past the die and package were first attached and then the electrical connections from the die to the package were made by wire bonding. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks, and be at a safe distance from neighboring lead wires. Wire loops in these packages are 8 to 12 mils, while those of ultra-thin packages are 4 to 5 mils. Wire bonding has been done with either gold or aluminum wires. Both types of wire are highly conductive and ductile enough to withstand deformation during the bonding steps and remain strong and reliable.

Wire bonding between a die and a package has several problems. One problem is that a wire bond attachment to a die limits the number of pads and placement of the pads on the die. In addition, minimum height limits are imposed by the required wire loops. Another problem is that there is a chance of electrical performance problems or shorting if the wires come too close to each other. The wire bonds also require two bonds and must be placed one-by-one and there are resistance levels associated with each bond. The wires are also relatively long and thus could contribute significantly to lead inductance and capacitance. This could limit acceptable signal speed in the system.

To increase the number of pad sites available for a die and to address the problems stated above and other problems, a different chip packaging technique called controlled collapse chip connection or flip chip packaging has been adopted. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. As a result, the dies are commonly called flip chips in the industry. Each bump connects to a corresponding package inner lead. The packages which result are lower profile and have lower electrical resistance and a shortened electrical path. The output terminals of the package may be ball-shaped conductive bump contacts (usually solder, or other similar conductive material) which are typically disposed in a rectangular array. These packages are occasionally referred to as "Ball Grid Array" (BGA). Alternatively, the output terminals of the package may be pins and such a package is commonly known as pin grid array (PGA) package.

Once the die is attached to the package the backside portion of the die remains exposed. The transistors and other circuitry are generally formed in a very thin epitaxially grown silicon layer on a single crystal silicon wafer from which the die is singulated. The side of the die having the epitaxial layer with the transistors and the other active circuitry is often referred to as the circuit side of the die or front side of the die. The circuit side of the die is positioned very near the package and opposes the backside of the die. Between the backside and the circuit side of the die is single crystalline silicon. The positioning of the circuit side provides many of the advantages of the flip chip. However, in some instances the orientation of the die with the circuit side face down on a substrate may be a disadvantage or present new challenges. When a circuit fails or when it is necessary to modify a particular chip, access to the transistors and circuitry near the circuit side is obtained only from the backside of the chip. This is challenging since the transistors are in a very thin layer (about 10$\mu$m) of silicon buried under the bulk silicon (>500$\mu$m). Thus, the circuit side of the flip chip die is not visible or accessible for viewing using optical or scanning electron microscopy.

Although the circuit of the integrated circuit (IC) is buried under the bulk silicon, infrared (IR) microscopy is capable of imaging the circuit because silicon is relatively transparent in these wavelengths of the radiation. However, because of the absorption losses of IR radiation in silicon, it is generally required to thin the die to less than 100 microns in order to view the circuit using IR microscopy. Thus, on a die that is 725 microns thick, at least 625 microns of silicon should be removed before IR microscopy can be used. Thinning the die for failure analysis of a flip chip bonded IC is usually accomplished in two or three steps. First, the die is thinned across the whole die surface. This is also referred to as global thinning. Global thinning is done to allow viewing of the active circuit from the backside of the die using IR microscopy. Mechanical polishing is one method for global thinning.

Once it is determined that access to a particular area of the circuit is needed, local thinning techniques are used to thin an area smaller than the die size. Laser micro-chemical etching of silicon is one method of local thinning. One method for laser micro-chemical etching of silicon is accomplished by focussing a laser beam on the backside of the silicon surface to cause local melting of silicon in the presence of chlorine gas. The molten silicon reacts very rapidly with chlorine and forms silicon tetrachloride gas, which leaves the molten (reaction) zone. This is a silicon removal process used on the 9850 SiliconEtcher™ tool by Revise, Inc. (Burlington, Mass). This laser process is suitable for both local and global thinning by scanning the laser over a part or whole surface of the die.

Sometimes it is necessary for failure analysis, or for design debug, to make electrical contact and probe certain nodes in the circuit that is on the circuit side or front side of the die. This is generally done by milling through the die to access the node, or milling to the node and subsequently depositing a metal to electrically access the node. These access holes need to have high aspect rations. For design debug, it is desirable to have the capability to cut and reroute the interconnect lines. Milling through silicon with fairly high aspect ratio trenches is slow and is almost impractical for silicon thickness greater than 10 microns. For these reasons, it is necessary to have a method and apparatus which will provide for controlled thinning of flip chip bonded IC devices to less than 10 micron thickness. It is also necessary to have a method where the thickness of the silicon can be determined with sufficient accuracy to avoid milling off the node to which access is being sought. Milling off the node could often jeopardize further device analysis.

The need for a method for accurately determining the thickness of the silicon is not eliminated by merely thinning the backside to a distance away from the package to which the die is attached. Various parts tolerances do not allow for such a simple solution to approaching the circuit side of the die from the back side of the die. One tolerance issue is keeping the height of solder ball contacts on the die substantially uniform for every packaged device of a particular type. Even though the solder ball contacts have a tolerance requirement, when the solder is reflowed to attach the die to a package, the amount of change in height due to solder reflow can vary by several microns. The thickness of the die between the circuit side and backside is also subject to tolerance differences. Since the thickness of the starting silicon wafer is a nonessential parameter for making a functioning die, typically the die thickness is not known to an accurate level. For instance, a typical die for a microprocessor may have a die thickness of approximately 725 microns that varies by ±15microns. The end result is an accumulated tolerance due to the tolerances for the size of the solder balls, the height at which the die is attached and the thickness of the die. These tolerances accumulate such that there can be tens of microns of difference in height from the top surface of the package to the top surface of the die among different packaged devices. Although this may not appear to be a significant tolerance problem, it will be appreciated that that the epitaxial layer is only between 2 and 10 microns thick. As a result, the thickness of the remaining silicon of a trench cannot be gauged by measuring from the top surface of the package to the bottom of the trench. The accumulated tolerances of the various parts precludes simply "measuring up" from the package to which the die is attached to determine where the epitaxial layer containing the transistors begins. Simply stated, such an approach is not accurate enough to prevent damaging the circuitry or transistors to be analyzed.

Therefore, flip chip technology requires a method for exposing selected circuitry in the die without damaging the circuit in the process.

SUMMARY OF THE INVENTION

The method and apparatus described herein involves determining the endpoint in a milling process that removes silicon from the back side of a semiconductor device. In an example embodiment, a voltage level is supplied to the device and an ion beam is directed at a selected area of the back side of the device in the presence of a gas that is reactive with the substrate. While etching, the quantity of secondary particles emitted from the selected area of the device is monitored. When the quantity of emitted secondary particles reaches a predetermined level, the ion beam is stopped and the reactive gas is removed.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The following detailed description of the various example embodiments can best be understood when read in conjunction with the following drawings, in which.

While the invention is amenable to various modifications and alternative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
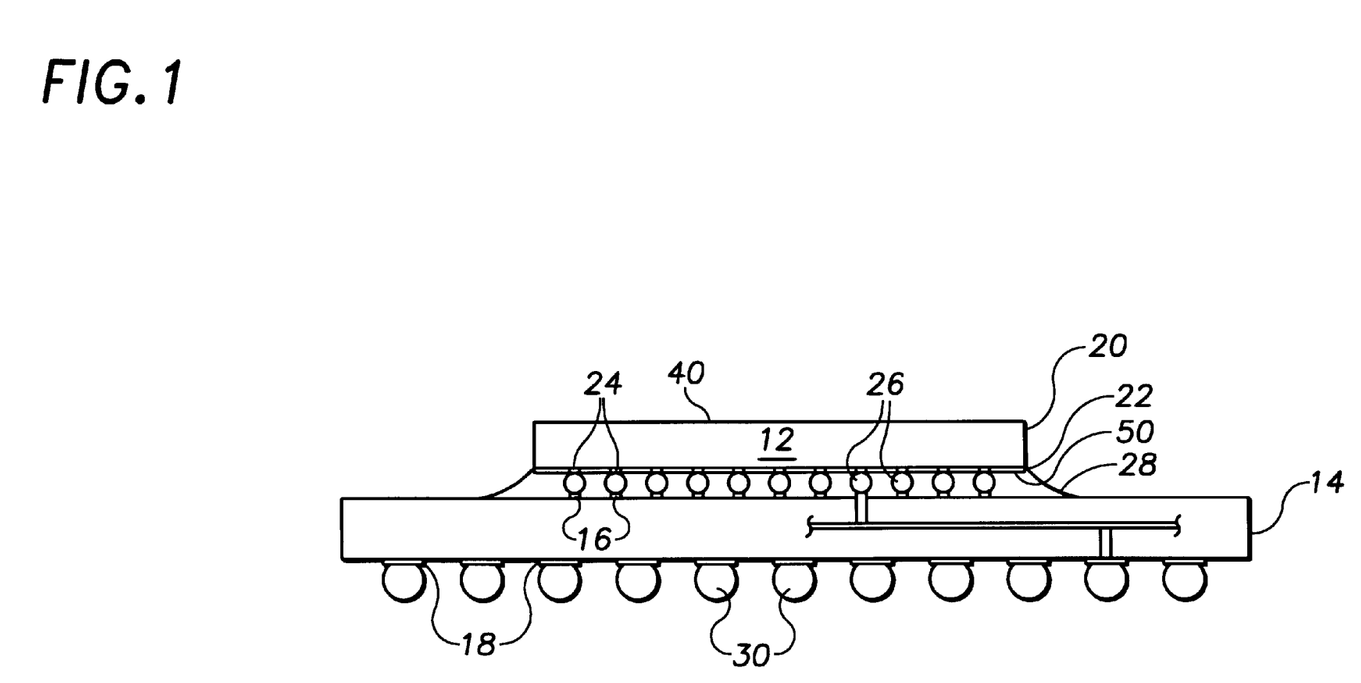
FIG. 1 shows a side view of a flip chip type die assembled to a package substrate.

FIG. 1 shows a side view of a flip chip type die 12 assembled to a package substrate 14. Flip chip die 12 has a circuit side 50 and a backside 40. The circuit side 50 includes a number of circuit devices formed near the circuit side in a portion of the die known as the epitaxial layer 22. The epitaxial layer 22 has a thickness in the range of 1 to 15 microns. The portion of the die shown above the epitaxial layer is known as the bulk polysilicon layer 20. A plurality of solder bumps 26 are made on the circuit side 50 at pads 24. The solder bumps 26 are the inputs and outputs to the circuitry associated with the die 12. The flip chip type die 12 is attached to package substrate 14, such as a package for a flip chip via the solder bumps on the die 12. The package substrate 14 includes pads 16 which are arranged to correspond to the pattern of solder bumps on the die 12. The region between integrated circuit 12 and package substrate 14 is filled with an under-fill material 28 to encapsulate the solder bump connections and provide additional mechanical benefits.

Figure 2:
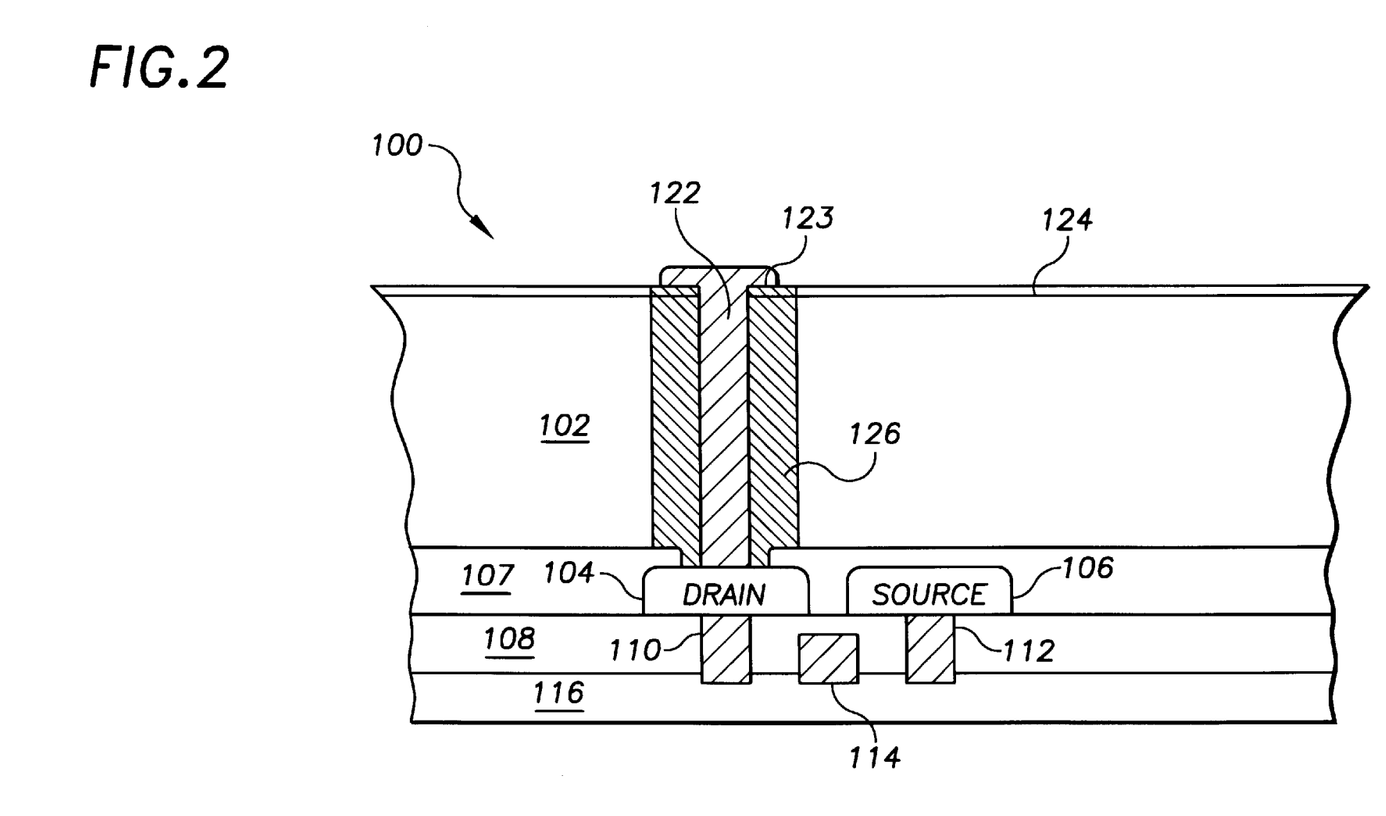
FIG. 2 is a cross-sectional view of a semiconductor structure having a probe that extends from the rear surface of the substrate to an active region.

FIG. 2 is a cross-sectional view of a semiconductor structure 100 having probe 122 that extends from rear surface 124 of substrate 102 to an active region. Structure 100 is an example of one which benefits from the method of etching described herein. Structure 100 includes substrate 102 having formed therein drain region 104 and source region 106. Structure 100 can be constructed using conventional semiconductor processes, and p-type and n-type dopants are used in the various regions in accordance with implementation requirements. Drain and source regions 104 and 106 are example "active" regions formed in the epitaxial layer 107 of semiconductor structure 100.

Structure 100 also includes an electrically insulative layer 108 through which electrical conductors 110 and 112 are respectively coupled to drain and source regions 104 and 106. Gate electrode 114 is arranged to switch the transistor formed by drain region 104, source region 106, and gate electrode 114.

Electrical conductors 110, 112, and 114 extend into interconnect and passivation layer 116 where they are coupled to other signal lines (not shown) of the integrated circuit of which structure 100 is a part.

An electrically conductive probe 122 extends from rear surface 124 and is coupled to an example one of the active regions, namely, drain region 104. Coupling probe 122 to drain region 104 eliminates the need to locate an interconnect signal line (not shown) in interconnect layer 116 that is coupled to drain region 104 and that at some location in the integrated circuit is accessible for constructing a probe.

Probe 122 includes pad portion 123 that is large enough to make contact with conventional micro-probe test equipment. In addition, probe 122 is electrically insulated from substrate 102 with electrically insulative material 126.

To construct example probe 122 where various active regions, 104 and 106 for example, have been formed in substrate 102, a selected portion of the substrate at the desired location is etched away, leaving approximately 4–5 microns of substrate covering the region to be probed. A focused ion beam system can be used to create the final hole through the substrate to region 104. The focused ion beam system can also be used to deposit electrically insulative material 126.

The illustrated shapes of the elements 102–124 are intended to serve as examples. Those skilled in the art will recognize that semiconductor structures can assume many different shapes and profiles depending on the particular implementation requirements for the integrated circuit.

Figure 3:
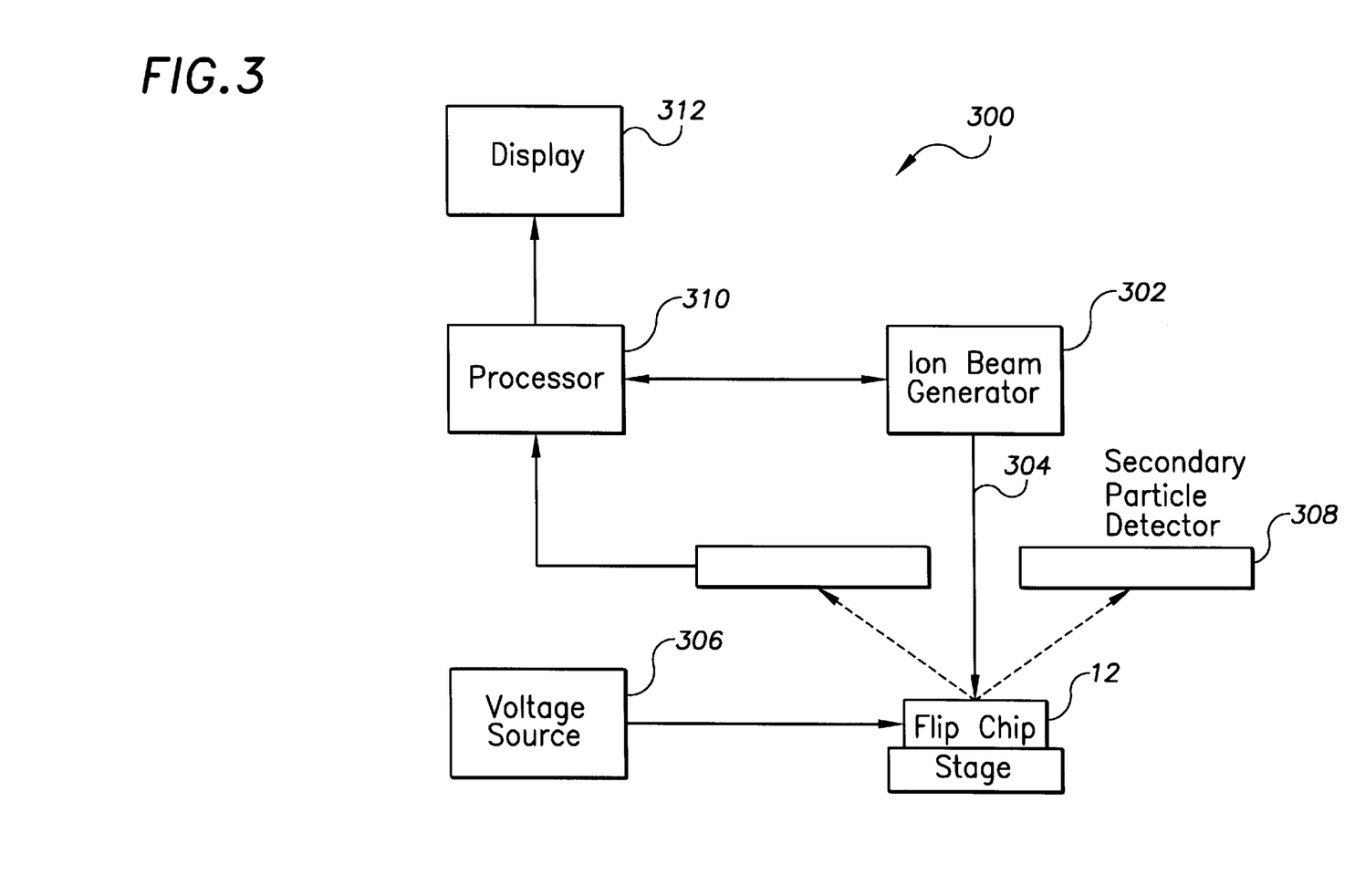
FIG. 3 shows a schematic view of an example system for etching the backside of a flip chip type die and controlling the etch by monitoring energy levels of secondary particles emitted from the flip chip during etching.

FIG. 3 shows a schematic view of an example system 300 for etching the backside of flip chip type die 12 and controlling the etch by monitoring the number of secondary particles emitted from the flip chip during etching. System 300 includes focused ion beam (FIB) generator 302 for generating focused ion beam 304 which, in the presence of a gas that is reactive with the substrate, is used to etch the die. The reactive gas may be, for example, xenon difluoride or chlorine. Localized thinning is done on an area of the backside 40 which is less than the entire area of the backside 40, as further illustrated in FIGS. 5 and 6. Generally, system 300 can be used for both global and localized thinning of die 12. While not shown, it will be appreciated that system 300 also includes conventional apparatus for directing beam 304 at a selected area of flip chip 12. While etching, flip chip 12 is connected to a voltage source 306 to bias conductors in the flip chip at +3 V, for example. While not shown it will be understood that various test vectors may be applied to flip chip 12 in order to provide the positive voltage level at selected conductors.

System 300 also includes secondary particle detector 308 for detecting secondary particles emitted by the flip chip 12 and resulting from FIB 304. Detector 308 may be, for example, a microchannel plate (MCP) as are known in the art, or alternatively, a channeltron detector. Detector 308 is capable of detecting secondary particles which include secondary electrons and secondary ions. Generally, detector 308 attracts and captures the secondary particles emitted by flip chip 12, and provides a signal having a magnitude that is proportional to the number of particles detected at any given instant. The type of secondary particles detected may be determined by the polarity of the bias voltage applied to detector 308. When selecting whether to detect secondary electrons or secondary ions, it should be considered that detecting secondary electrons may be preferable because of the positive surface charging of flip chip 12 and an increased sensitivity for detection of any electric potential within the flip chip due to a much smaller mass of electrons as compared to ions.

While etching with the FIB, any voltage present within the portion of the flip chip being etched and irradiated due to surface charging by the FIB and/or electrical stimulus applied to flip chip 12 by voltage source 306 acts to modulate secondary electron emission from the flip chip. Higher voltage regions that are irradiated by FIB 304 will have suppressed emissions of secondary electrons relative to lower voltage regions that are irradiated with the FIB. Thus, the epitaxial layer (for example, having drain region 104) when being etched with a FIB and having a voltage level applied to the necessary circuitry will suppress secondary electron emissions as compared to emissions from substrate 102 when the substrate is being etched. Voltage in flip chip 12 also analogously modulates emission of secondary ions.

System 300 also includes processor 310 and display 312, wherein detector 308 is coupled to the processor. Responsive to signals from detector 308, processor 310 stores digital representations of the signals in a memory array having cells that respectively correspond to the rastered coordinates of flip chip 12. Processor 310 also continuously reads the values from the memory array and generates a gray-scale image for output to display 312. The field of view is operator-selectable and may be set according to the selected area of flip chip 12 being etched.

A low voltage area will generally appear as a light region in the image because of a relatively large number of secondary particles emitted from the area. The area appears as a dark region in the image when fewer secondary particles are emitted from the area, for example when the epitaxial layer is reached. Thus, by monitoring the number of secondary particles emitted, the process of etching through substrate 102 can be controlled so that the process is stopped before an active region is encountered.

In one embodiment, an operator can monitor the image presented on display 312 while etching flip chip 12 with a FIB. In a first mode where secondary electrons are being detected and the image changes from light to dark, the operator can manually stop ion beam generator 302.

Similarly, when etching in a second mode where secondary ions are being detected and the image changes from dark to light, the operator can manually stop ion beam generator 302.

In another embodiment, processor 310 can be programmed to detect the aforementioned changes in the image and automatically stop ion beam generator 302. This requires coupling processor 310 to ion beam generator 302. For each of the two modes (secondary electron and secondary ion detection), the processor uses, for example, a baseline image corresponding to that which is generally known to be rendered when the FIB etch reaches an end point in the flip chip. The baseline image can be generated, for example, through experimentation with a selected number of flip chips.

Example FIB systems are described in U.S. Pat. No. 5,844,416 to Campbell et al., and U.S. Pat. No. 5,821,549 to Talbot et al., the contents of which are incorporated herein by reference. Additional example FIB systems include the 9800FC FIB system from Micron, Inc. and various FIB systems from FEI company.

Figure 4:
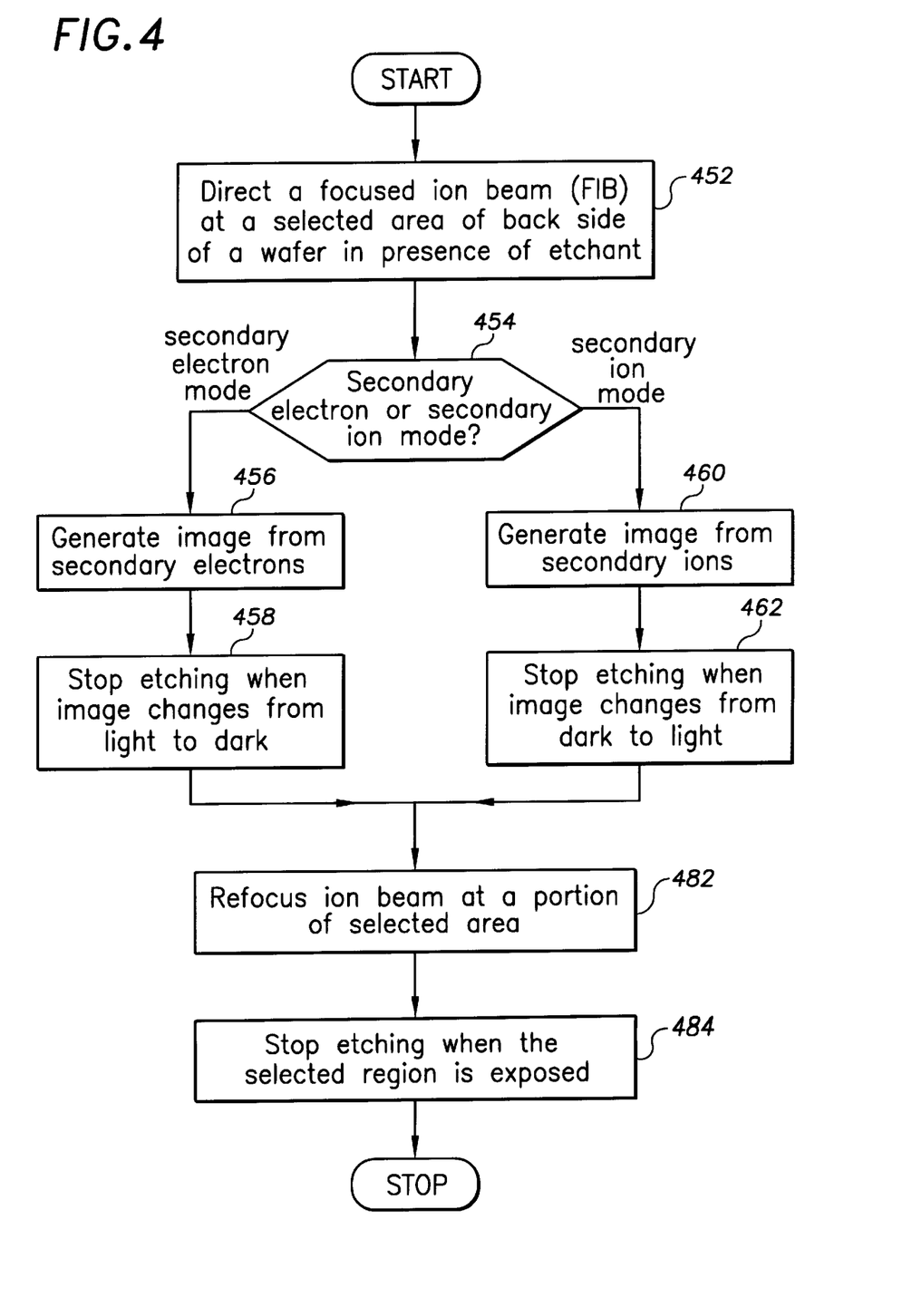
FIG. 4 is a flowchart of an example process for etching the backside of a flip chip.

FIG. 4 is a flowchart of an example process for etching the backside of a flip chip. Generally, the process entails etching with a FIB system, along with a selected reactive gas, and monitoring the emission from the flip chip of either secondary electrons or secondary ions. In the example embodiment, the emissions are monitored with an image generated in response to detected secondary particles. When an expected change in the image is observed, either visually or with a computer, the FIB is stopped.

At step 452, a FIB is directed at a selected area of the backside of a flip chip. The selected area may be, for example, a location at which a probe is desired. Example system 300 of FIG. 3 can be operated in one of two modes: detecting secondary electrons or detecting secondary ions, wherein the mode is selected by an operator. In the mode of detecting secondary electrons, step 454 directs the process to step 456. At step 456, an image is generated from secondary electrons emitted from the flip chip and detected by FIB system 300. The image is, for example, a digital image. When the image changes from light to dark (indicating the portion of the flip chip being etched is, or is near, the epitaxial layer), the FIB is stopped, and the etchant is removed at step 458.

In the mode of detecting secondary ions, step 454 directs the process to step 460, where the FIB system generates an image from detected secondary ions. When the image changes from dark to light (indicating the portion of the flip chip being etched is, or is near, the epitaxial layer), the FIB is stopped, and the etchant is removed at step 462.

Figure 5:
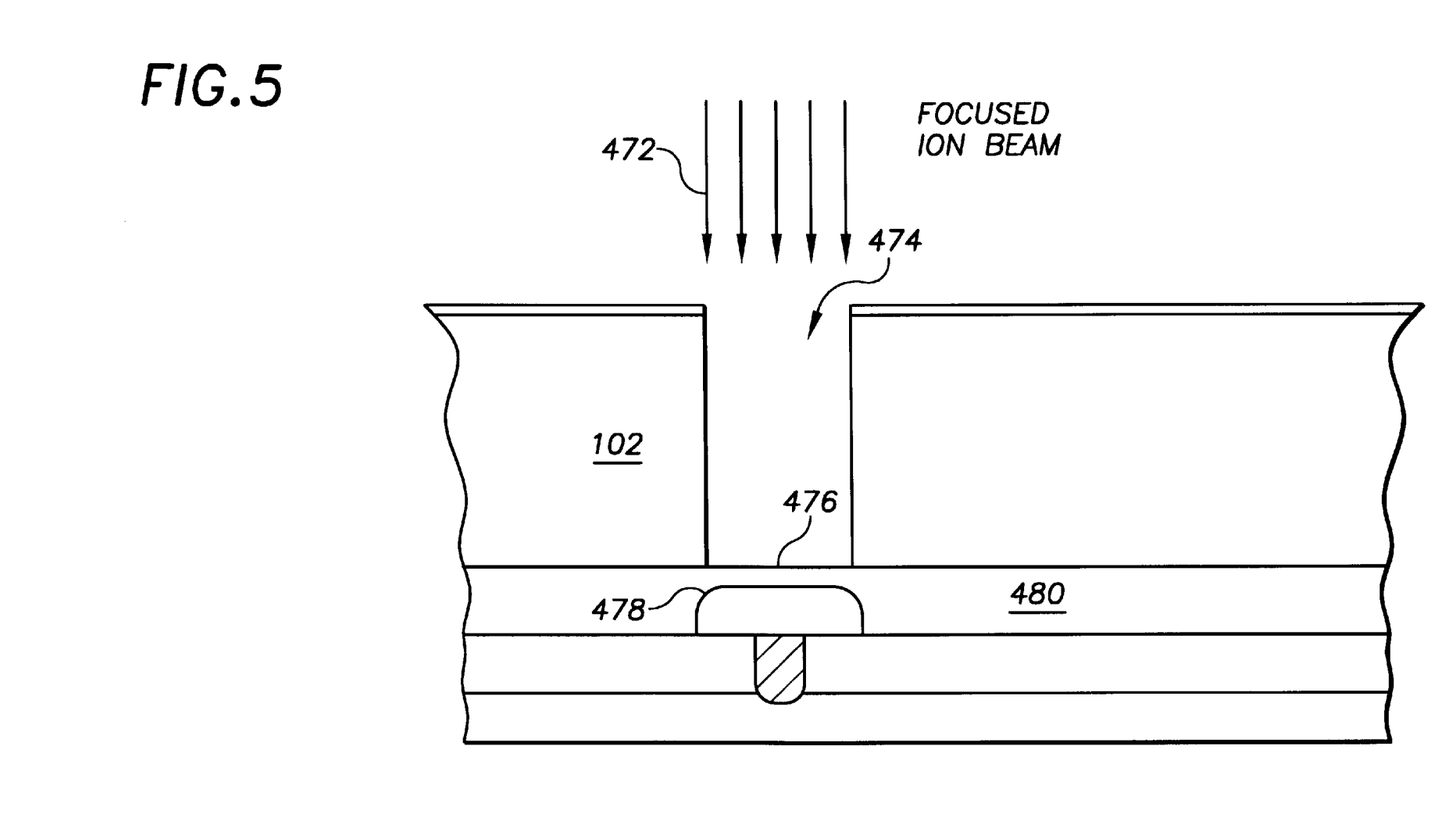
FIG. 5 is a cross-sectional view of a flip chip at which a focused ion beam is directed to etch a trench.
Figure 6:
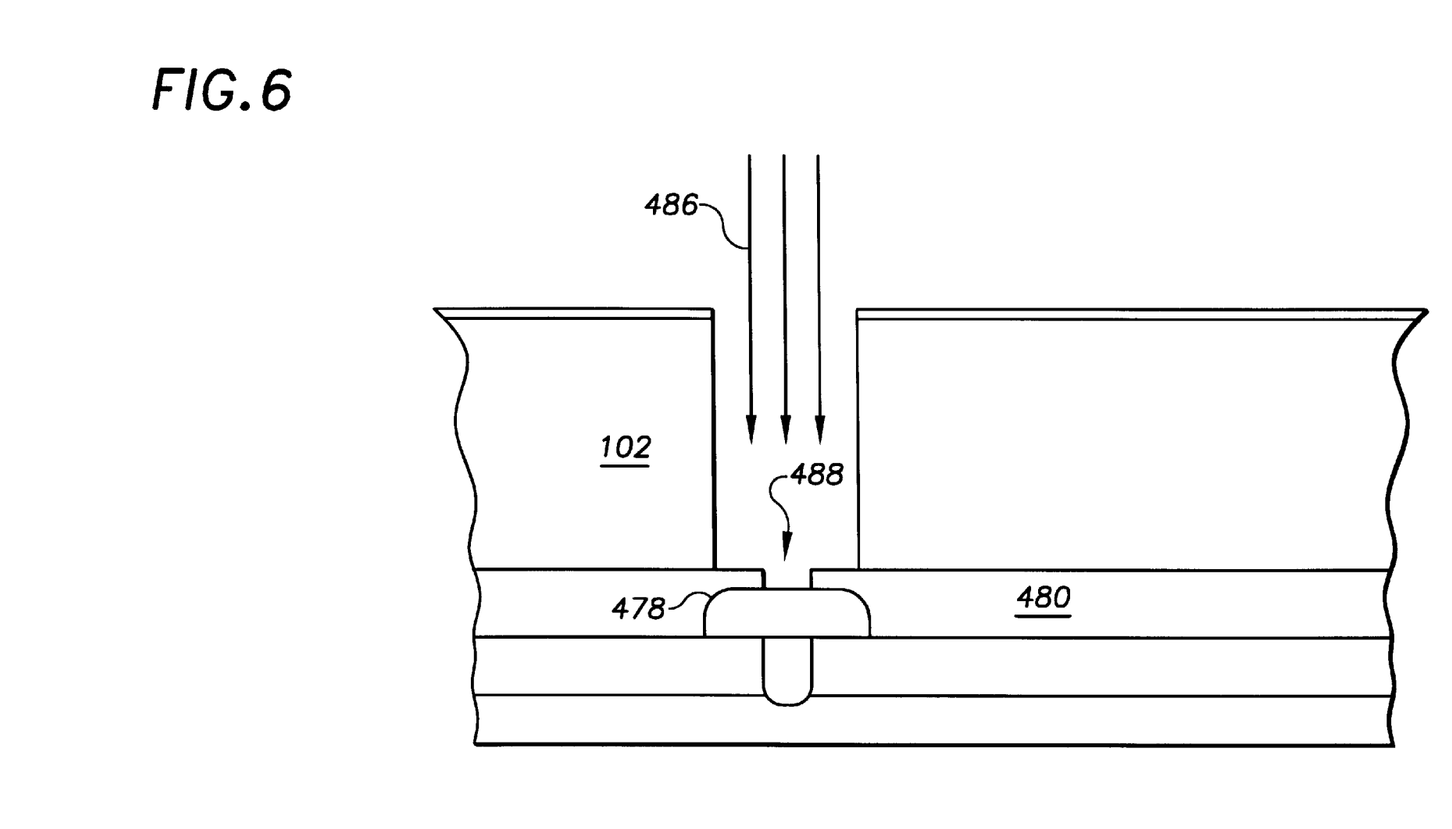
FIG. 6 is a cross-sectional view of a flip chip at which a focused ion beam is directed to etch a portion from the base of the trench.

Before continuing with the process of FIG. 4, it may be helpful to first consider the flip chip cross-sectional views of FIGS. 5 and 6. FIG. 5 is a cross-sectional view of a flip chip at which FIB 472 is directed to etch trench 474. While etching substrate 102 in the mode of detecting secondary electrons, the image displayed by system 300 (FIG. 3) is generally light. As the base 476 of trench 474 approaches active region 478 in epitaxial layer 480, the image will change from light to dark, as explained above. When the image has changed to a desired level of darkness, the etching process is stopped. It will be appreciated that the desired level of darkness (in the mode of detecting secondary electrons, or level of lightness in the mode of detecting secondary ions) can be determined by experimentation.

FIG. 6 is a cross-sectional view of a flip chip at which FIB 486 is directed. Continuing now with steps 482 and 484 of the process of FIG. 4, FIB 486 is narrowed (FIG. 6) in order to etch a narrow opening 488 to expose active region 478. FIB 486 can be adjusted by changing the aperture (not shown) through which the beam is sent. Methods such as visual inspection, or conventional stage current monitoring when milling to an interconnect, may be required to determine when the selected region has been exposed, for example when a junction or interconnect has been reached. At step 484, etching is stopped when the selected region has been exposed. Processing then continues with formation of a probe to contact region 478, as described in the co-pending patent application, The present invention has been described with reference to particular embodiments. These embodiments are only examples of the invention's application and should not be taken as a limitation. It will be appreciated that the invention may work with current induced from other sources and is not limited to the field of semiconductors. This invention could be used in other industries and with other materials. Various adaptations and combinations of features of the embodiments disclosed are within the scope of the present invention as defined by the following claims.

What is claimed is:

1. A method for etching the substrate of a semiconductor device to expose a selected region in the substrate, the semiconductor device having a circuit side and back side, the method comprising:

supplying a voltage level to the device;

directing an ion beam at a selected area of the back side of the device in the presence of a gas that is reactive with the substrate;

monitoring a quantity of secondary particles emitted from the selected area of the device while the ion beam is directed at the device; and stopping the ion beam and removing the reactive gas when the quantity of emitted secondary particles reaches a level indicative of the selected region.

2. The method of claim 1, further comprising:

refocusing the ion beam at a portion of the selected area when the quantity of emitted secondary particles reaches the level;

stopping the refocused ion beam and removing the reactive gas when the selected region is exposed.

3. The method of claim 1, wherein the secondary particles are electrons.

4. The method of claim 3, wherein the level of secondary electrons is less than the quantity of the secondary electrons emitted while etching the substrate.

5. The method of claim 4, further comprising:

detecting the secondary particles;

generating an image from the detected secondary electrons; and monitoring the image for a change from light to dark.

6. The method of claim 5, further comprising stopping the ion beam when the image changes from light to dark.

7. The method of claim 6, further comprising:

refocusing the ion beam at a portion of the selected area when the quantity of emitted secondary electrons reaches the level;

stopping the refocused ion beam and removing the reactive gas when the selected region is exposed.

8. The method of claim 4, further comprising:

detecting the secondary electrons;

generating a pixel-based image from the detected secondary electrons; and monitoring intensity levels of pixels comprising the image for a change from light to dark; and automatically stopping the ion beam when the image changes from light to dark.

9. The method of claim 1, wherein the secondary particles are ions.

10. The method of claim 9, wherein the quantity of secondary ions is greater than the quantity of secondary ions emitted while etching the substrate.

11. The method of claim 10, further comprising:

detecting the secondary ions;

generating an image from the detected secondary ions; and monitoring the image for a change from dark to light.

12. The method of claim 11, further comprising stopping the ion beam when the image changes from dark to light.

13. The method of claim 12, further comprising:

refocusing the ion beam at a portion of the selected area when the quantity of emitted secondary ions reaches the level;

stopping the refocused ion beam and removing the reactive gas when the selected region is exposed.

14. The method of claim 10, further comprising:

detecting the secondary ions;

generating a pixel-based image from the detected secondary ions; and monitoring intensity levels of pixels comprising the image for a change from dark to light; and automatically stopping the ion beam when the image changes from dark to light.

* * * * *

UNITED STATES PATENT AND TRADEMARK OFFICE
CERTIFICATE OF CORRECTION

PATENT NO. : 6,210,981 B1
DATED : April 3, 2001
INVENTOR(S) : Birdsley et al.

It is certified that error appears in the above-identified patent and that said Letters Patent is hereby corrected as shown below:

Column 3,
Line 43, "15microns" should read -- 15 microns --.

Column 7,
Line 20, "Micron, Inc." should read -- Micrion, Inc. --.

Column 8,
Line 67, please delete "and".

Column 10,
Line 11, please delete "and".

Signed and Sealed this

Thirtieth Day of April, 2002

Attest:

JAMES E. ROGAN
*Director of the United States Patent and Trademark Office*

*Attesting Officer*